United States Patent [19]
Hill

[11] Patent Number: 6,023,202
[45] Date of Patent: Feb. 8, 2000

[54] GROUND RETURN FOR HIGH SPEED DIGITAL SIGNALS THAT ARE CAPACITIVELY COUPLED ACROSS A DC-ISOLATED INTERFACE

[75] Inventor: Gregory A. Hill, Loveland, Colo.

[73] Assignee: Hewlett-Packard Company, Palo Alto, Calif.

[21] Appl. No.: 09/023,841

[22] Filed: Feb. 13, 1998

[51] Int. Cl.[7] .................................................. H03H 7/01
[52] U.S. Cl. ......................... 333/24 C; 333/12; 361/763
[58] Field of Search .................................... 333/12, 24 C, 333/1; 361/763, 780

[56] References Cited

U.S. PATENT DOCUMENTS

| | | | |
|---|---|---|---|
| 4,339,668 | 7/1982 | Mueller et al. | 333/24 C X |
| 4,987,391 | 1/1991 | Kusiak, Jr. | 333/24 C X |
| 5,165,055 | 11/1992 | Metsler | 333/12 |
| 5,781,078 | 7/1998 | Jones | 333/12 |

OTHER PUBLICATIONS

"Isolation Using Dynamic Termination Circuitry", Version 1.4, Jan. 12, 1998, Copyright 1997, IBM Corporation, p. 21 of 55, IBM Microelectronics Division, 1580 Route 52, Hopewell Junction, New York 12533.

"IEEE 1394–1995 400 Mb/s PHYsical Layer Transceiver," Version 0.9, May 9, 1997, Copyright 1997, IBM Corporation, IBM Microelectronics Division, 1580 Route 52, Hopewell Junction, New York 12533. pp. 13–14, 29–31.

H. Ott, *Noise Reduction Techniques in Electronic Systems*, (Mar. 1998) A Wiley–Interscience Publication, pp. 280–286.

High Performance Serial Bus, (Mar. 1995), IEEE Std. 1394–1995, pp. 245–348.

*Primary Examiner*—Justin P. Bettendorf

[57] ABSTRACT

A ground return scheme is provided for multiple high speed digital signals that are capacitively coupled between networks, where the networks are connected to different ground planes (i.e. they are isolated) on a common circuit board. A first embodiment of the invention provides a low impedance ground path for each signal crossing the isolation boundary. The ground path is achieved by placing a ground return capacitor proximate to the signal coupled capacitor to substantially minimize the loop area of the total current path. This arrangement substantially minimizes the self inductance of each signal current path and the mutual inductance, i.e. coupling, between signal paths. The arrangement also has the benefit of reducing self-induced voltage drops in each ground return path, thereby reducing crosstalk between the signals, reducing ground bounce (resulting in faster settling times), and also reducing common-mode voltage induced between the grounding systems. Consequently, application of the invention produces improved signal integrity, reduced generation of electromagnetic emissions, and reduced susceptibility to electromagnetic interference. A second embodiment of the invention adds common-mode chokes to each signal-ground pair. The chokes provide a measure of high-frequency isolation between the ground systems, as well as between the various signal paths.

20 Claims, 4 Drawing Sheets

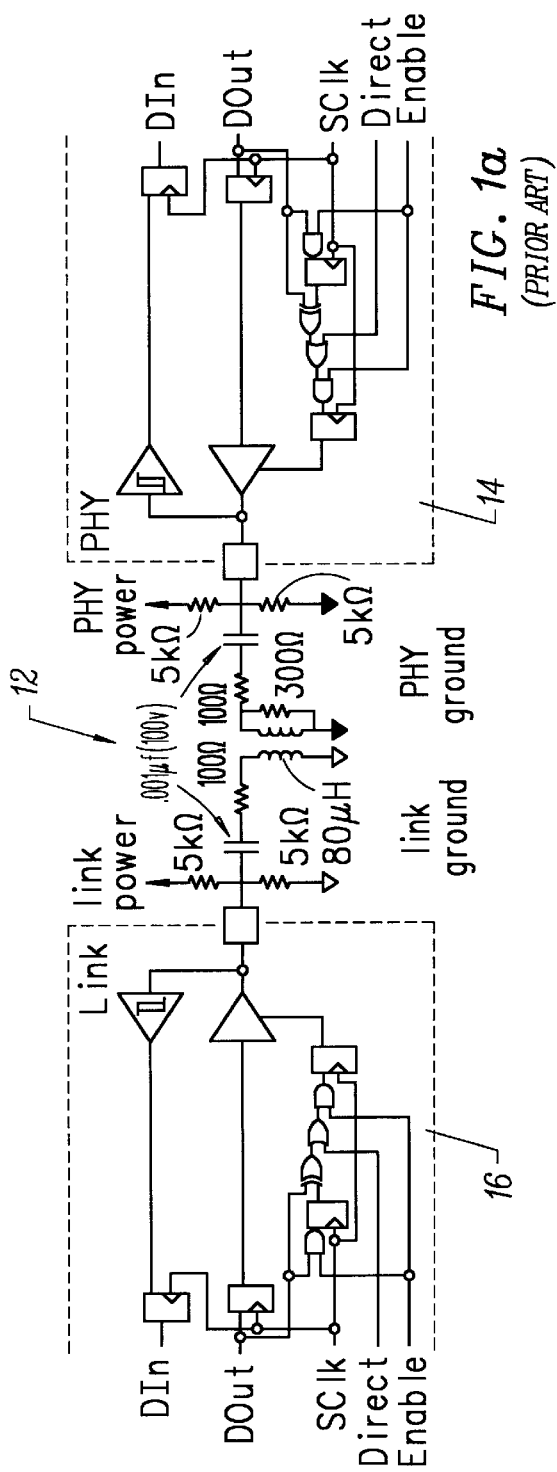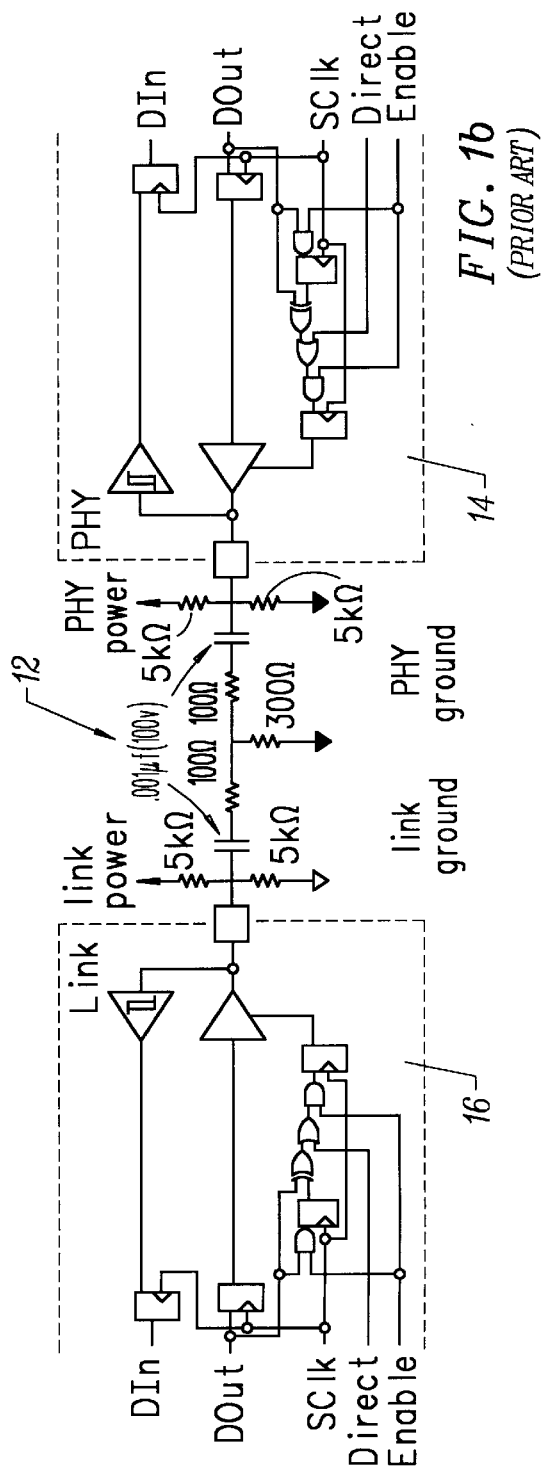
FIG. 1a (PRIOR ART)
FIG. 1b (PRIOR ART)

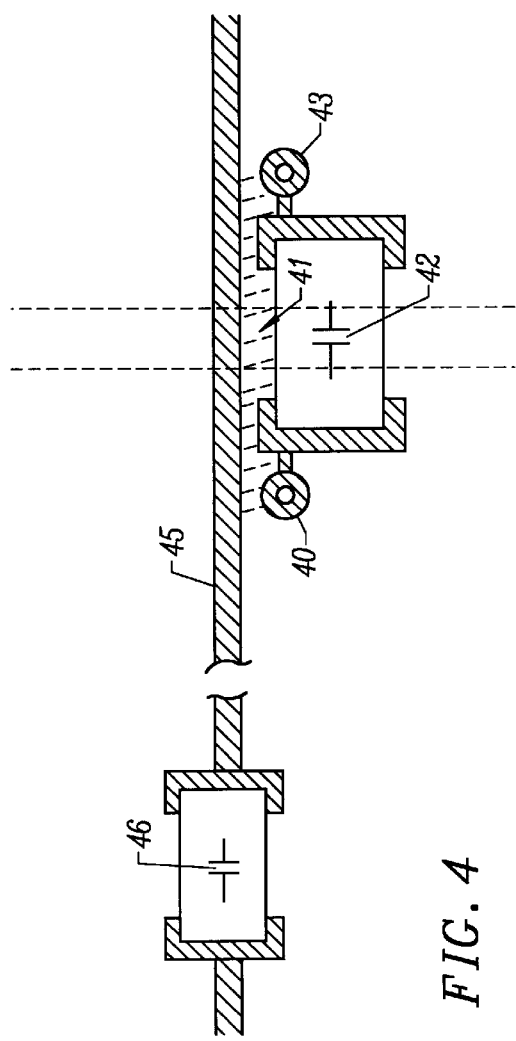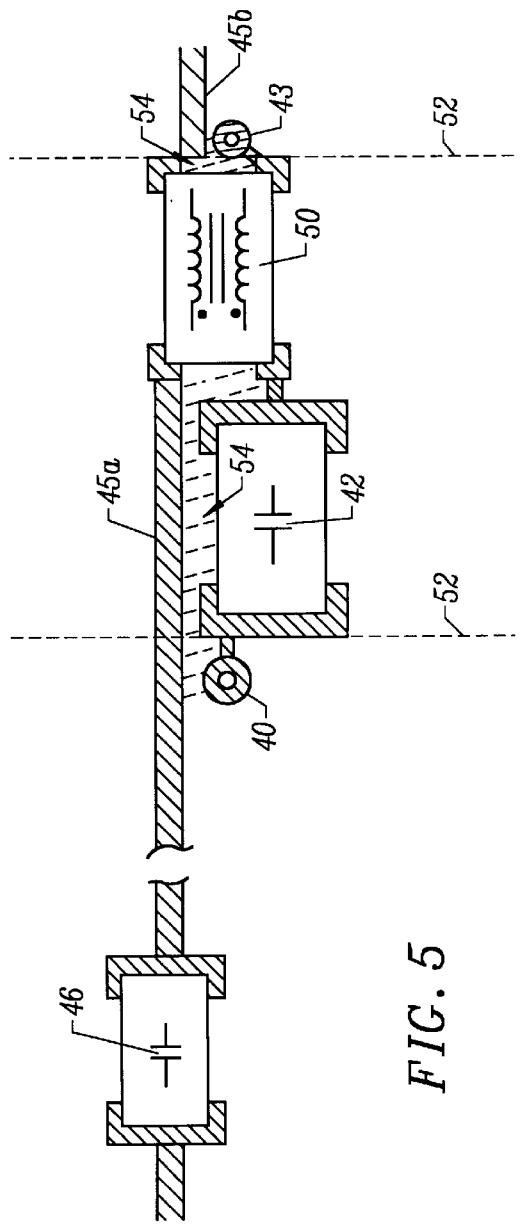

GROUND RETURN FOR HIGH SPEED DIGITAL SIGNALS THAT ARE CAPACITIVELY COUPLED ACROSS A DC-ISOLATED INTERFACE

BACKGROUND OF THE INVENTION

1. Technical Field

The invention relates to circuits for coupling electronic signals across a signal path. More particularly, the invention relates to a ground return for use where high speed digital signals are capacitively coupled across a DC-isolated interface.

2. Description of the Prior Art

Various data transfer techniques have evolved as the need to move information, in terms of both speed and quantity, has increased. One promising technique is provided by the Firewire (IEEE 1394) specification. Proposed actual data rates (i.e. independent of any encoding scheme) for Firewire are in multiples of ~100 Mbit/s.

A central component of the Firewire specification is the link layer—physical layer interface, which is typically implemented in two discrete integrated circuits ("ICs"). Data are transmitted between these two ICs on a data bus. The data bus between the physical layer IC and the link layer IC is clocked at the same rate for all supported speeds. The data rate is increased by widening the bus. Thus, the physical layer uses two bits for 100 Mb/s data transfers, four bits for 200 Mb/s data transfers, and eight bits for 400 Mb/s data transfers.

A two bit wide CNTL bus carries control information. An LREQ pin is used by the link layer to request access to the serial bus and to read or write physical layer registers.

There are four basic operations that may occur in the link layer—physical layer interface, i.e. request, status, transmit, and receive. All of these but request are initiated by the physical layer. The link layer uses the request operation to read or write an internal physical layer register or to ask the physical layer to initiate a transmit action. The physical layer initiates a receive action when a packet is received from the serial bus.

It is necessary to isolate the link layer IC and the physical layer IC electrically when a difference in potential exists between their respective grounds ($GND_L$ and $GND_P$). The Firewire specification requires galvanic isolation between a cable signal ground and a device's earth ground. Thus, a particular device connected to the link layer, e.g. a CPU or disk drive, may present the need for isolation. Electrical isolation may also be implemented when the link layer is disconnected and the physical layer is powered via a cable.

FIGS. 1a and 1b are block schematic diagrams electrical isolation in a typical Firewire device. Such isolation in Firewire is achieved by an isolation barrier 12 between the physical layer (PHY) interface circuit 14 and the link layer (LINK) circuit 16. There are 6–12 high speed digital signals crossing this PHY-LINK boundary, including a 50-MHz clock and 25-MHz control and data signals. The IEEE 1394 specification allows both magnetically coupled (FIG. 1a) and capacitively coupled (FIG. 1b) isolation circuits for these signals.

Both the IEEE 1394 specification (see J.6 Isolation Barrier, pp. 347, IEEE Std. 1394–1995) and manufacturers of PHY/LINK devices (for example, see Link—Phy Electrical Isolation, IBM21S850PFC IEEE 1394–1995 400 Mb/s PHYsical Layer Transceiver, Application Notes, Version 0.9, pp. 29 (May 9, 1997)) provide for the use of capacitive isolation. However, none of the presently available approaches address the issue of grounding. Thus, while typical implementations of Firewire may include one or two ground return capacitors, such capacitors are not necessarily adjacent to the signal lines.

Accordingly, there has been some difficulty in implementing the PHY/LINK isolation layer. For example, some of the problems encountered when implementing Firewire include self inductance of each signal current path and mutual inductance, i.e. coupling, between signal paths; self-induced voltage drops in each ground return path, resulting in crosstalk between the signals; ground bounce, resulting in slow settling times; and common-mode voltage induced between the grounding systems, resulting in radiated emissions from cables that are attached to isolated grounds.

It would be advantageous to provide a technique for such communications protocols as provided, for example by Firewire, that produces improved signal integrity, reduced generation of electromagnetic emissions, and reduced susceptibility to electromagnetic interference.

SUMMARY OF THE INVENTION

The invention provides a ground return scheme for multiple high speed digital signals that are capacitively coupled between networks, where the networks are connected to different ground planes (i.e. they are isolated) on a common circuit board.

A first embodiment of the invention provides a low impedance ground path for each signal crossing the isolation boundary. The ground path is achieved by placing a ground return capacitor proximate to the signal coupled capacitor to substantially minimize the loop area of the total current path. In particular, while the two capacitors may be placed adjacent to each other, there is slightly less loop area if the capacitors are staggered. It is important that the path length from one ground plane via, through the common return capacitor, to the other ground plane via be as short as possible, and that the area enclosed by this path and the main signal trace (between its closest approaches to the vias) be substantially minimized.

This arrangement substantially minimizes the self inductance of each signal current path and the mutual inductance, i.e. coupling, between signal paths.

The arrangement also has the benefit of reducing self-induced voltage drops in each ground return path, thereby reducing crosstalk between the signals, reducing ground bounce (resulting in faster settling times), and also reducing common-mode voltage induced between the grounding systems. Minimizing the common-mode ground voltage is important for controlling the radiated emissions from cables that are attached to isolated grounds, e.g. in the Firewire (IEEE 1394) protocol. Consequently, application of the invention produces improved signal integrity, reduced generation of electromagnetic emissions, and reduced susceptibility to electromagnetic interference.

A second embodiment of the invention adds common-mode chokes to each signal-ground pair. The chokes provide a measure of high-frequency isolation between the ground systems, as well as between the various signal paths. This arrangement further reduces crosstalk, the generation of electromagnetic emissions, and susceptibility to electromagnetic interference.

BRIEF DESCRIPTION OF THE DRAWINGS

FIGS. 1a and 1b are block schematic diagrams showing PHY/LINK electrical isolation for a typical Firewire (IEEE 1394) device;

FIG. 4 is a sectional schematic diagram showing an optimal ground return capacitor layout according to the first embodiment of the invention; and FIG. 5 is a sectional schematic diagram showing an optimal ground return capacitor and choke layout according to the second embodiment of the invention.

DETAILED DESCRIPTION OF THE INVENTION

The invention provides a ground return scheme for multiple high speed digital signals that are capacitively coupled between networks, where the networks are connected to different ground planes (i.e. they are isolated) on a common circuit board. The discussion herein is directed to the Firewire (IEEE 1394) specification for purposes of example and illustration of the presently preferred embodiment of the invention. It should be appreciated by those skilled in the art that the technique herein disclosed is nonetheless readily adapted to any application in which one or more digital signals are coupled across an isolation barrier between system elements having different ground planes.

Figure 2:
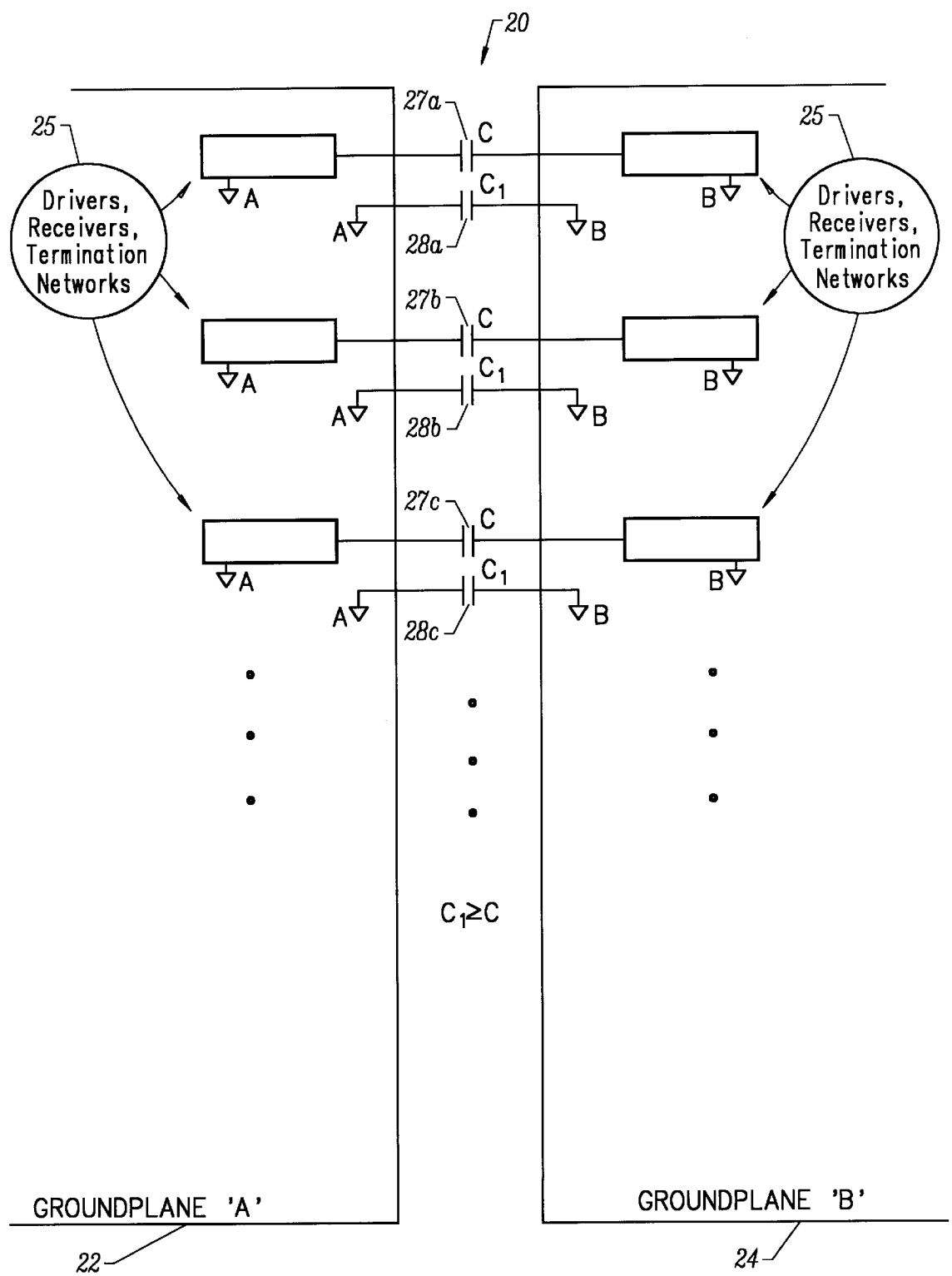
FIG. 2 is a block schematic diagram of a ground return scheme for high speed digital signals that are capacitively coupled across a DC-isolated interface according to a first embodiment of the invention.

FIG. 2 is a block schematic diagram of a ground return scheme for high speed digital signals that are capacitively coupled across a DC-isolated interface according to a first embodiment of the invention. The first embodiment of the invention provides a low impedance ground path for each signal crossing an isolation boundary 20 between system elements 25, such as drivers, receivers, terminators, or networks, that reside on different ground planes 22, 24. Isolation between the two ground planes is provided by signal coupled capacitors 27a–27c . . . The ground path is achieved by placing a ground return capacitors 28a–28c . . . proximate to the signal coupled capacitors to substantially minimize the loop area of the total current path. The ground return capacitors used in the presently preferred embodiment of the invention are 10,000 pF ceramic surface mount capacitors and the signal coupled capacitors are 1000 pF ceramic surface mount capacitors.

While the two capacitors may be placed adjacent to each other, there is slightly less loop area if the capacitors are staggered. It is important that the path length from one ground plane via, through the common return capacitor, to the other ground plane via be as short as possible, and that the area enclosed by this path and the main signal trace (between its closest approaches to the vias) be substantially minimized (see FIG. 4, discussed below).

This arrangement substantially minimizes the self inductance of each signal current path and the mutual inductance, i.e. coupling, between signal paths. The arrangement also has the benefit of reducing self-induced voltage drops in each ground return path, thereby reducing crosstalk between the signals, reducing ground bounce (resulting in faster settling times), and also reducing common-mode voltage induced between the grounding systems. Minimizing the common-mode ground voltage is important for controlling the radiated emissions from cables that are attached to isolated grounds, e.g. in the Firewire (IEEE 1394) protocol. Consequently, application of the invention produces improved signal integrity, reduced generation of electromagnetic emissions, and reduced susceptibility to electromagnetic interference.

Figure 3:
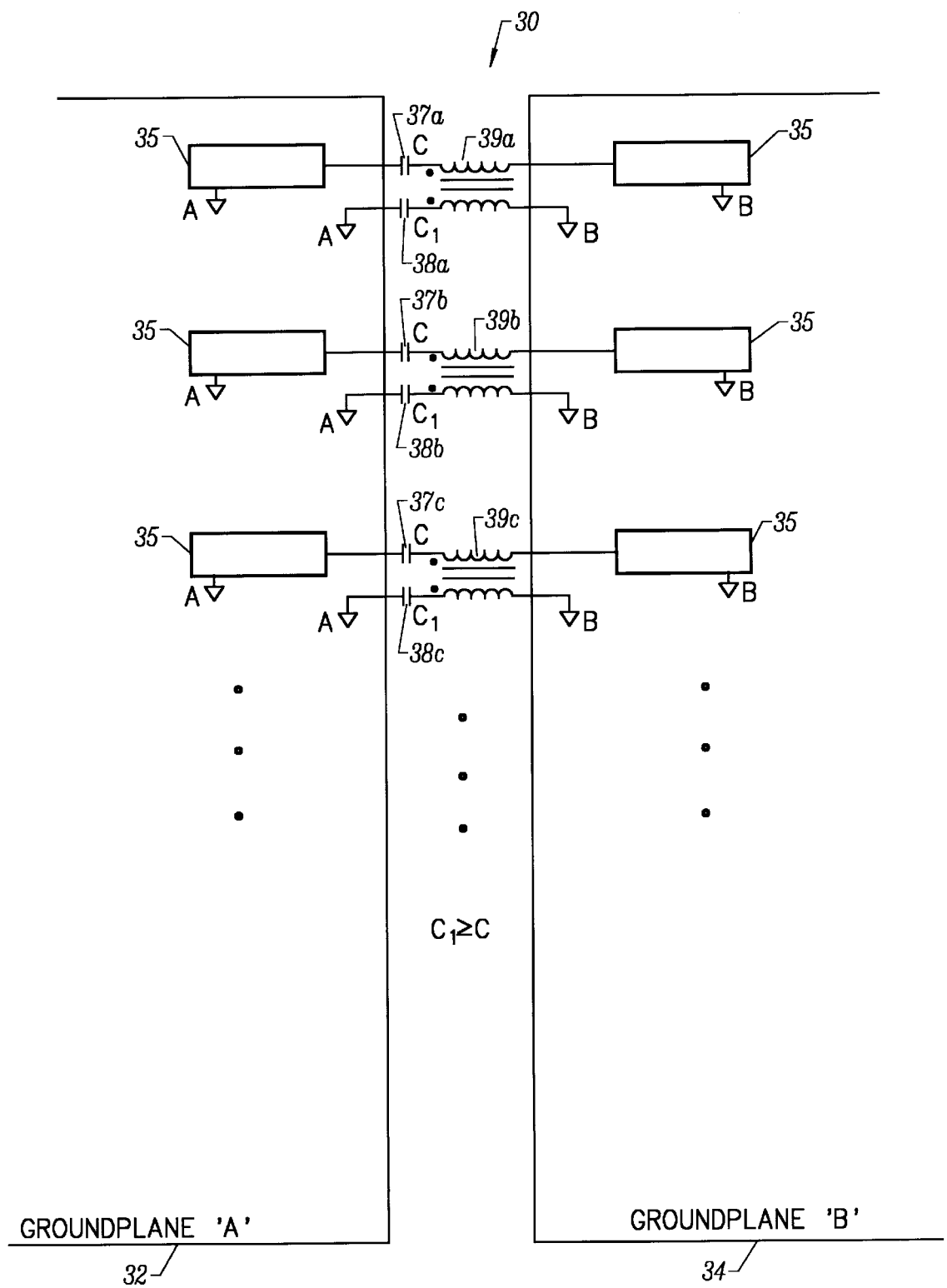
FIG. 3 is a block schematic diagram of a ground return scheme for high speed digital signals that are capacitively coupled across a DC-isolated interface according to a second embodiment of the invention.

FIG. 3 is a block schematic diagram of a ground return scheme for high-speed digital signal that are capacitively coupled across a DC-isolated interface according to a second embodiment of the invention. The second embodiment of the invention also provides a low impedance ground path for each signal crossing an isolation boundary 30 between system elements 35, such as drivers, receivers, terminators, or networks, that reside on different ground planes 32, 34. Isolation between the two ground planes is provided by signal coupled capacitors 37a–37c . . . The ground path is achieved in part by placing a ground return capacitors 38a–38c . . . proximate to the signal coupled capacitors to substantially minimize the loop area of the total current path. The ground return capacitors used in the presently preferred embodiment of the invention are 10,000 pF ceramic surface mount capacitors and the signal coupled capacitors are 1000 pF ceramic surface mount capacitors.

While the two capacitors may be placed adjacent to each other, there is slightly less loop area if the capacitors are staggered. It is important that the path length from one ground plane via, through the common return capacitor, to the other ground plane via be as short as possible, and that the area enclosed by this path and the main signal trace (between its closest approaches to the vias) be substantially minimized.

The second embodiment of the invention adds common-mode chokes 39a–39c to each signal-ground pair. The chokes provide a measure of high-frequency isolation between the ground systems, as well as between the various signal paths. This arrangement further reduces crosstalk, the generation of electromagnetic emissions, and susceptibility to electromagnetic interference. In the preferred embodiment of the invention, the chokes are ferrite surface mount devices having an impedance of 1000 Ohms+/−25% @ 100 MHz (for example, part no. ACM3225-102-2P, manufactured by TDK of Japan).

The chokes comprise a pair of cross coupled inductors and are shown in FIG. 3 with one side of each inductor connected to either a signal coupled capacitor or a ground return capacitor, and the other side of each inductor coupled to a system element and an associated ground plane, respectively. It should be appreciated that the chokes may be connected directly to either ground plane, with the capacitive elements connected to the other side thereof, and thence to the other ground plane. It is not necessary that both capacitive elements be connected to the same side of the chokes as shown in FIG. 3. The technique herein is as effective if the capacitors are arranged on opposite sides of the choke. However, in this case the coils of the choke are at different ground potentials, and the choke's design must be adequate to withstand the desired isolation voltage FIG. 4 is a sectional schematic diagram showing an optimal ground return capacitor layout according to the first embodiment of the invention. As discussed above, the ground return capacitors are positioned proximate to the signal coupled capacitors. The path length from one ground plane via 40, through the common return capacitor 42, to the other ground plane via 43 should be as short as possible. The area 41 enclosed by this path and the main signal trace 45 (between its closest approaches to the vias—see the dashed parallel lines on FIG. 4) should also be substantially minimized. FIG. 4 shows the signal coupled capacitor 46 and ground return capacitor 42 in a staggered relationship.

FIG. 5 is a sectional schematic diagram showing an optimal ground return capacitor and choke layout according to the second embodiment of the invention. As discussed above, the ground return capacitors are positioned proximate to the signal coupled capacitors. The path length from one ground plane via 40, through the common return capacitor 42, to the other ground plane via 43 should be as short as possible. The area 54 enclosed by this path and the main signal trace 45a/45b (between its closest approaches to the vias, as defined by the edges of the two ground planes—see the dashed parallel lines 52 on FIG. 5) should also be substantially minimized. FIG. 5 shows the signal coupled capacitor 46 and ground return capacitor 42 in a staggered relationship. As discussed above, although the ground return and signal coupled capacitors are shown on the same side of the choke 50, the two capacitors may also be placed on opposite sides of the choke.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. An isolation barrier for coupling one or more digital signals between system elements having different ground planes, comprising:

one or more capacitive signal crossings, each of said capacitive signal crossings routing a corresponding one of said one or more digital signals across an isolation boundary between said system elements; and a low impedance ground path for each signal crossing comprising a ground return capacitor connected between said different ground planes and located proximate to a corresponding capacitive signal crossing to substantially minimize the loop area of a total current path.

2. The isolation barrier of claim 1, wherein said system elements comprise Firewire (IEEE 1394) elements.

3. The isolation barrier of claim 2, wherein said Firewire (IEEE 1394) elements comprise physical layer and link layer elements.

4. The isolation barrier of claim 1, wherein said ground return capacitor and said capacitive signal crossing are located adjacent each other.

5. The isolation barrier of claim 1, wherein said ground return capacitor and said capacitive signal crossing are staggered relative to each other.

6. The isolation barrier of claim 1, wherein the path length from a first ground plane to a second ground plane through said ground return capacitor is substantially minimized.

7. The isolation barrier of claim 1, wherein the area enclosed by the path through said ground return capacitor and a corresponding main signal path is substantially minimized.

8. An isolation barrier for coupling one or more digital signals between system elements having different ground planes, comprising:

one or more signal-ground pairs, each of said signal-ground pairs comprising:

a capacitive signal crossing for routing a corresponding one of said one or more digital signals across an isolation boundary between said system elements; and a low impedance ground path comprising a ground return capacitor connected between said different ground planes and located proximate to a corresponding capacitive signal crossing to substantially minimize the loop area of a total current path; and a common-mode choke for each signal-ground pair, wherein said common-mode choke provides high-frequency isolation between said ground planes, as well as between said one or more digital signals.

9. The isolation barrier of claim 8, wherein said system elements comprise Firewire (IEEE 1394) elements.

10. The isolation barrier of claim 9, wherein said Firewire (IEEE 1394) elements comprise physical layer and link layer elements.

11. The isolation barrier of claim 8, wherein said ground return capacitor and said capacitive signal crossing are located adjacent each other.

12. The isolation barrier of claim 8, wherein said ground return capacitor and said capacitive signal crossing are staggered relative to each other.

13. The isolation barrier of claim 8, wherein the path length from a first ground plane to a second ground plane through said ground return capacitor is substantially minimized.

14. The isolation barrier of claim 8, wherein the area enclosed by the path through said ground return capacitor and a corresponding main signal path is substantially minimized.

15. A method for coupling one or more digital signals across an isolation barrier between system elements having different ground planes, comprising the steps of:

providing one or more capacitive signal crossings, each of said capacitive signal crossings routing a corresponding one of said one or more digital signals across an isolation boundary between said system elements; and providing a low impedance ground path for each signal crossing comprising a ground return capacitor connected between said different ground planes and located proximate to a corresponding capacitive signal crossing to substantially minimize the loop area of a total current path.

16. The method of claim 15, wherein said system elements comprise Firewire (IEEE 1394) elements.

17. The method of claim 16, wherein said Firewire (IEEE 1394) elements comprise physical layer and link layer elements.

18. A method for coupling one or more digital signals across an isolation barrier between system elements having different ground planes, comprising the steps of:

providing one or more signal-ground pairs, each of said signal-ground pairs comprising:

a capacitive signal crossing for routing a corresponding one of said one or more digital signals across an isolation boundary between said system elements; and a low impedance ground path comprising a ground return capacitor connected between said different ground planes and located proximate to a corresponding capacitive signal crossing to substantially minimize the loop area of a total current path; and providing a common-mode choke for each signal-ground pair, wherein said common-mode choke provides high-frequency isolation between said ground planes, as well as between said one or more digital signals.

19. The method of claim 18, wherein said system elements comprise Firewire (IEEE 1394) elements.

20. The method of claim 19, wherein said Firewire (IEEE 1394) elements comprise physical layer and link layer elements.

* * * * *